United States Patent
Shin et al.

(10) Patent No.: US 10,056,534 B2
(45) Date of Patent: Aug. 21, 2018

(54) METHOD FOR COATING CONDUCTIVE SUBSTRATE WITH ADHESIVE

(71) Applicant: G-SMATT CO., LTD., Pyeongtaek-si (KR)

(72) Inventors: Hak Ryul Shin, Busan (KR); Ho Joon Lee, Seoul (KR)

(73) Assignee: G-SMATT CO., LTD., Pyeongtaek-si (KR)

( * ) Notice: Subject to any disclaimer, the term of this patent is extended or adjusted under 35 U.S.C. 154(b) by 404 days.

(21) Appl. No.: 14/778,075

(22) PCT Filed: Mar. 13, 2014

(86) PCT No.: PCT/KR2014/002111
§ 371 (c)(1),
(2) Date: Sep. 17, 2015

(87) PCT Pub. No.: WO2014/148770
PCT Pub. Date: Sep. 25, 2014

(65) Prior Publication Data
US 2016/0284958 A1    Sep. 29, 2016

(30) Foreign Application Priority Data
Mar. 18, 2013  (KR) .................. 10-2013-0028662

(51) Int. Cl.
*H01L 33/62* (2010.01)
*H01L 21/00* (2006.01)
(Continued)

(52) U.S. Cl.
CPC ............. *H01L 33/62* (2013.01); *H01L 24/27* (2013.01); *H01L 24/29* (2013.01); *H01L 24/30* (2013.01); *H01L 24/32* (2013.01); *H01L 24/33* (2013.01); *H01L 24/743* (2013.01); *H01L 24/83* (2013.01); *H05K 3/305* (2013.01); *H05K 3/321* (2013.01); *H01L 2224/27312* (2013.01); *H01L 2224/29006* (2013.01); *H01L 2224/29007* (2013.01);
(Continued)

(58) Field of Classification Search
CPC .............................. H01L 33/62; H01L 24/27
See application file for complete search history.

(56) References Cited

U.S. PATENT DOCUMENTS 6,562,406 B1 * 5/2003 Chikahisa ........... B05C 11/1034
118/410

FOREIGN PATENT DOCUMENTS

JP          10146558         6/1998
JP       2005-197927 A  *   7/2005
(Continued)

OTHER PUBLICATIONS

Machine Translation of Japanese Patent 2005-197927, Date Unknown.*
(Continued)

*Primary Examiner* — Jeffry H Aftergut
(74) *Attorney, Agent, or Firm* — Cantor Colburn LLP

(57) ABSTRACT

Disclosed is a method of coating a conductive substrate with an adhesive, wherein the amounts and positions of conductive and non-conductive adhesives for bonding a plurality of circuit elements to the conductive substrate are set, thus preventing the spread of the adhesive from causing defects, including a poor aesthetic appearance, low electrical conductivity, and short circuits.

6 Claims, 10 Drawing Sheets

(51) Int. Cl.
    *H05K 3/32* (2006.01)
    *H01L 23/00* (2006.01)
    *H05K 3/30* (2006.01)

(52) U.S. Cl.
    CPC ............ *H01L 2224/29012* (2013.01); *H01L 2224/29014* (2013.01); *H01L 2224/29027* (2013.01); *H01L 2224/29036* (2013.01); *H01L 2224/30131* (2013.01); *H01L 2224/30135* (2013.01); *H01L 2224/30136* (2013.01); *H01L 2224/30151* (2013.01); *H01L 2224/30155* (2013.01); *H01L 2224/30179* (2013.01); *H01L 2224/30505* (2013.01); *H01L 2224/32225* (2013.01); *H01L 2224/33135* (2013.01); *H01L 2224/33179* (2013.01); *H01L 2224/33505* (2013.01); *H01L 2224/743* (2013.01); *H01L 2224/8385* (2013.01); *H01L 2224/83192* (2013.01); *H01L 2224/83194* (2013.01); *H01L 2224/83851* (2013.01); *H01L 2224/83874* (2013.01); *H01L 2924/12041* (2013.01); *H01L 2933/0066* (2013.01); *H05K 2201/0108* (2013.01); *H05K 2201/10106* (2013.01); *H05K 2203/0126* (2013.01); *H05K 2203/166* (2013.01); *Y02P 70/613* (2015.11)

(56) References Cited

FOREIGN PATENT DOCUMENTS

| | | |
|---|---|---|
| JP | 2005197927 | 7/2005 |
| KR | 100618941 | 9/2006 |
| KR | 101188747 | 10/2012 |
| WO | 2007055455 | 5/2007 |
| WO | 2014014169 | 1/2014 |

OTHER PUBLICATIONS

International Search Report—PCT/KR2014/002111 dated May 12, 2014.
Written Opinion—PCT/KR2014/002111 dated May 12, 2014.

\* cited by examiner

METHOD FOR COATING CONDUCTIVE SUBSTRATE WITH ADHESIVE

TECHNICAL FIELD

The present invention relates to a method of coating a conductive substrate with an adhesive, and more particularly to a method of coating a conductive substrate with an adhesive, wherein the amounts and positions of conductive and non-conductive adhesives for bonding a plurality of circuit elements to the conductive substrate are set, thus preventing defects, including a poor aesthetic appearance, low electrical conductivity, and short circuits, from occurring due to the spread of the adhesive.

BACKGROUND ART

Typically, light-emitting devices, which are used outdoors, are exemplified by electronic display substrates using neon, cold cathode lamps (CCLs), or light-emitting diodes (LEDs). Also, examples of light-emitting devices, which are used indoors, include external electrode fluorescent lamps (EEFLs), cold cathode fluorescent lamps (CCFLs), and LED boards.

Neon lights and CCLs are problematic because they adopt high-voltage power supplies and thus consume a large amount of power, entail the risk of electric shock and fire, and furthermore have short lifetimes. Meanwhile, EEFLs and CCFLs are difficult to use outdoors because they operate at high frequency and have low illuminance and short lifetimes.

For electronic display substrates using LEDs, the rear of the light-emitting surface is blocked by a cover due to the processing of black film or wires on the rear side, so that only the unidirectional emission of light is possible.

Recently, light-emitting devices have come to be utilized as advertisement boards, rather than simply being used as illuminators, and are also widely employed for aesthetic purposes in the field of interior design.

In the aforementioned light-emitting devices, however, limitations are imposed on the sizes of lamps or stands for supporting the light-emitting devices, making it difficult to impart aesthetic appearances.

Hence, in order to attain aesthetic appearances, conductive substrates are typically devised, in which circuit elements are attached to electrodes and are then controlled using a controller to emit light, thus displaying text or images from the electrodes and also showing mobile images. Such conductive substrates are configured such that circuit elements are wired to the electrodes, and include circuit elements having two electrodes, three electrodes, and four electrodes.

In this regard, a conventional conductive substrate is disclosed in Korean Patent Application Publication No. 2008-0101250 (Laid-open date: Nov. 11, 2008). The conventional conductive substrate is configured such that circuit elements having two to four electrodes are bonded to the electrodes of a conductive substrate using a coating process with a conductive adhesive.

In the conventional conductive substrate, individual wires formed by etching of electrodes have to be electrically insulated from each other, but the adhesive applied to bond the circuit elements spreads depending on the amount and position thereof, thus causing short circuits due to contact between conductive adhesives, low electrical conductivity due to contact between conductive and non-conductive adhesives, and flowing of the adhesive out of the areas to which circuit elements are bonded, undesirably resulting in poor aesthetic appearances.

DISCLOSURE

Technical Problem

Accordingly, the present invention has been made keeping in mind the above problems encountered in the related art, and an object of the present invention is to provide a method of coating a conductive substrate with an adhesive, wherein the adhesive may be prevented from spreading by adjusting the amount of adhesive that is applied, the coating time, and the spray speed taking into consideration the number and size of electrodes of circuit elements attached to one surface of a substrate having conductivity, such as a conductor and a copper, iron or aluminum thin film.

Technical Solution

According to the present invention, the amounts and positions of conductive and non-conductive adhesives for bonding circuit elements to a conductive substrate are set, thus preventing defects, including a poor aesthetic appearance, low electrical conductivity, and short circuits, from occurring due to the spread of an adhesive.

Advantageous Effects

According to the present invention, the amount of adhesive that is applied on electrodes of circuit elements, the coating time, and the spray speed are selectively set depending on the size of circuit elements, so that the adhesive is applied in a suitable amount, thus preventing the aesthetic appearance from decreasing, preventing short circuits from occurring due to contact between conductive adhesives, and preventing the electrical conductivity from decreasing due to contact between conductive and non-conductive adhesives.

BEST MODE

Figure 1:
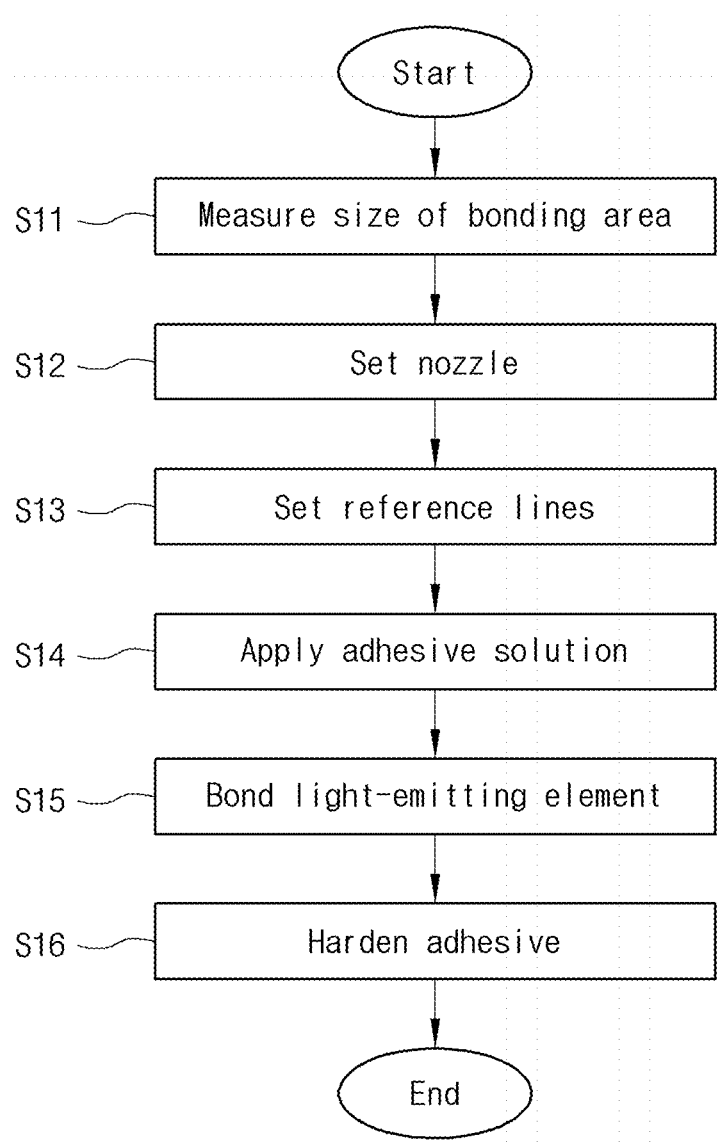
FIG. 1 is a flowchart illustrating the process of coating a conductive substrate with an adhesive according to the present invention.

In order to accomplish the above object, the present invention includes the following embodiments. A preferred embodiment of the present invention provides a method of coating a conductive substrate with an adhesive using an adhesive-discharging device for bonding a plurality of circuit elements to the conductive substrate, on which an electrode is formed so as to enable conduction of an electrical signal, wherein one or more center points are set at positions at which one or more transverse reference lines extending in a transverse direction and one or more longitudinal reference lines extending in a longitudinal direction intersect each other on a bonding area to which a circuit element is bonded, a nozzle of the adhesive-discharging device is positioned directly above each of the center points, and the adhesive is discharged in an amount calculated using the following Mathematical Formula:

$$M=AVT$$

wherein M=flow rate, A=inner diameter of nozzle, V=speed, and T=time, in which the inner diameter of the nozzle and the speed are fixed and the time is changed to thereby adjust the amount of the adhesive that is discharged depending on the inner diameter of the nozzle.

In another preferred embodiment of the present invention, the adhesive comprises a conductive adhesive and a non-conductive adhesive, the number of center points on the bonding area is set in a range from 1 to 4, and the nozzle of the adhesive-discharging device is positioned directly above each of the center points.

In another preferred embodiment of the present invention, transverse reference lines, which are set on the bonding area that is coated with the conductive adhesive, are set to extend in a transverse direction from positions spaced apart by 10% of the total length of the bonding area from opposite longitudinal ends of the bonding area, longitudinal reference lines are set to extend in a longitudinal direction from positions spaced apart by 10% of the total width of the bonding area from opposite transverse ends of the bonding area, and center points are set at positions at which the transverse reference lines and the longitudinal reference lines intersect each other.

In another preferred embodiment of the present invention, transverse reference lines of the conductive adhesive are set to extend in a transverse direction from positions corresponding to 10% of the total length of the bonding area from opposite longitudinal ends of the bonding area, a longitudinal reference line of the conductive adhesive is set to extend in a longitudinal direction from a position corresponding to 50% of the total width of the bonding area from a transverse end of the bonding area, and center points are set at positions at which the transverse reference lines and the longitudinal reference line intersect each other.

In another preferred embodiment of the present invention, a transverse reference line of the non-conductive adhesive is set to extend from a position corresponding to 50% of the total length of the bonding area, a longitudinal reference line of the non-conductive adhesive is set to extend in a longitudinal direction from a position corresponding to 50% of the total width of the bonding area, and a center point of the non-conductive adhesive is set at a position at which the transverse reference line and the longitudinal reference line intersect each other.

In another preferred embodiment of the present invention, transverse reference lines of the non-conductive adhesive include a first transverse reference line extending in a transverse direction from a position corresponding to 50% of the total length of the bonding area, and second transverse reference lines extending in a transverse direction from positions spaced upwards and downwards by 10% of the total length of the bonding area from the first transverse reference line, longitudinal reference lines of the non-conductive adhesive include a first longitudinal reference line extending in a longitudinal direction from a position corresponding to 50% of the total width of the bonding area, and second longitudinal reference lines extending in a longitudinal direction from positions spaced leftwards and rightwards by 10% of the total width of the bonding area from the first longitudinal reference line, and center points are set at positions at which the second transverse reference lines and the second longitudinal reference lines intersect each other.

In another preferred embodiment of the present invention, the bonding area is selected from among ranges of 0.8×1.6 to 1.5×1.6 mm, 1.5×1.6 to 1.4×3.0 mm, and 1.4×3.0 to 2.4×3.5 mm, and the inner diameter of the nozzle is selected from among 0.3 mm, 0.4 mm, and 0.5 mm, depending on the range of the bonding area.

MODE FOR INVENTION

Hereinafter, a detailed description will be given of a method of coating a conductive substrate with an adhesive according to preferred embodiments of the present invention with reference to the appended drawings.

According to the present invention, circuit elements are bonded to one surface of a substrate that enables the conduction of electrical signals, such as a conductor, a conductive substrate configured such that a conductive material is applied on one surface thereof to form an electrode, and a planar substrate manufactured from a copper, iron or aluminum thin film. Thus, the conductive substrate corresponds to any substrate that enables the conduction of electrical signals as described above.

As illustrated in the appended drawings, a transparent electronic display substrate is depicted, and is configured to include a plurality of patterns formed on a transparent electrode resulting from coating one surface of a transparent substrate with a conductive material, and circuit elements bonded to the patterns to emit light. The drawings are provided merely to illustrate embodiments of the present invention, and the present invention is not limited to a transparent electronic display substrate, but is applicable to all technical fields that include circuit elements bonded to conductive substrates. Below is a description of the gist according to the technical spirit of the present invention, made with reference to a transparent electronic display substrate.

Figure 2:
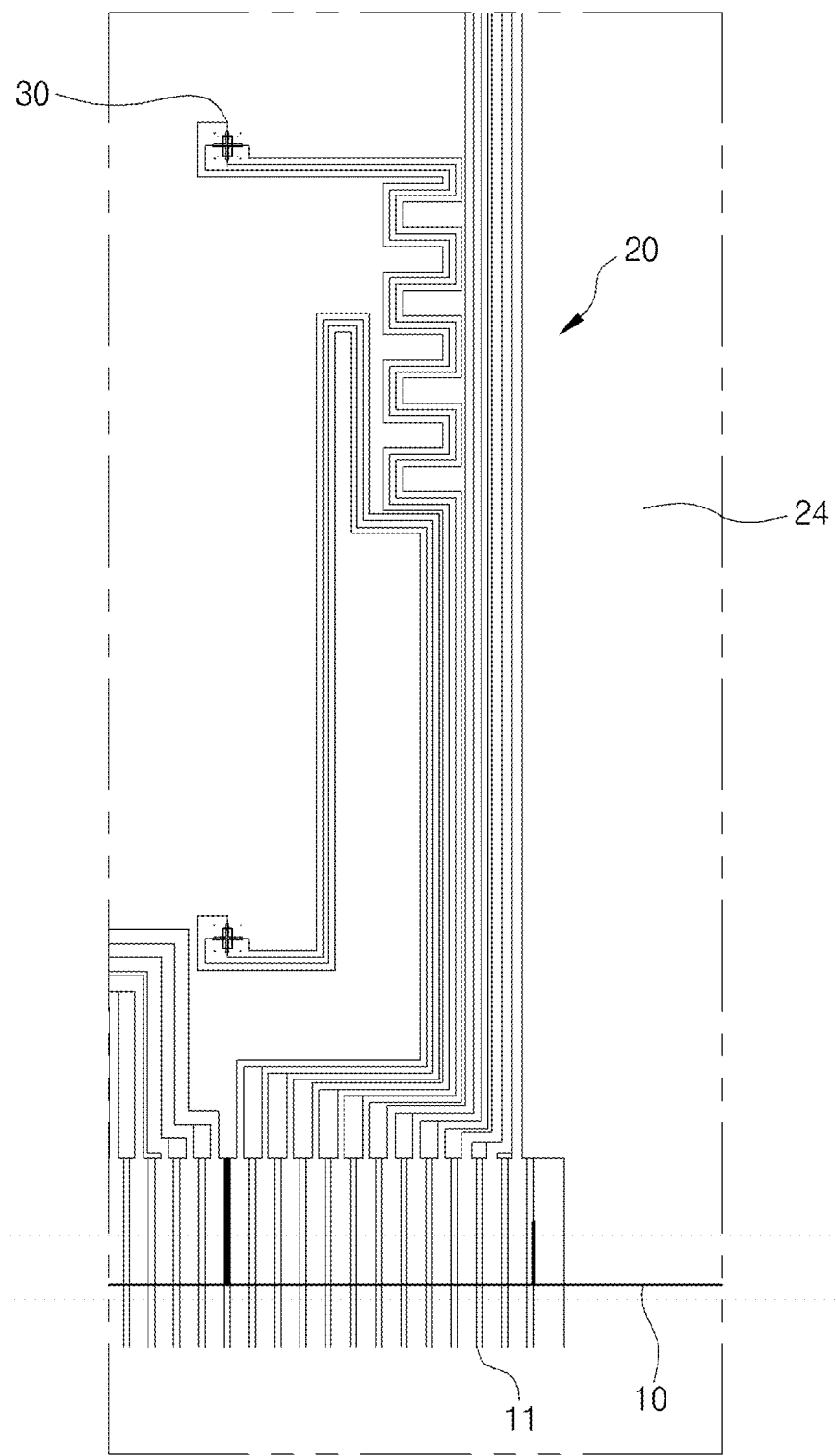
FIG. 2 illustrates a conductive substrate using the process of coating a conductive substrate with an adhesive according to the present invention.
Figure 3:
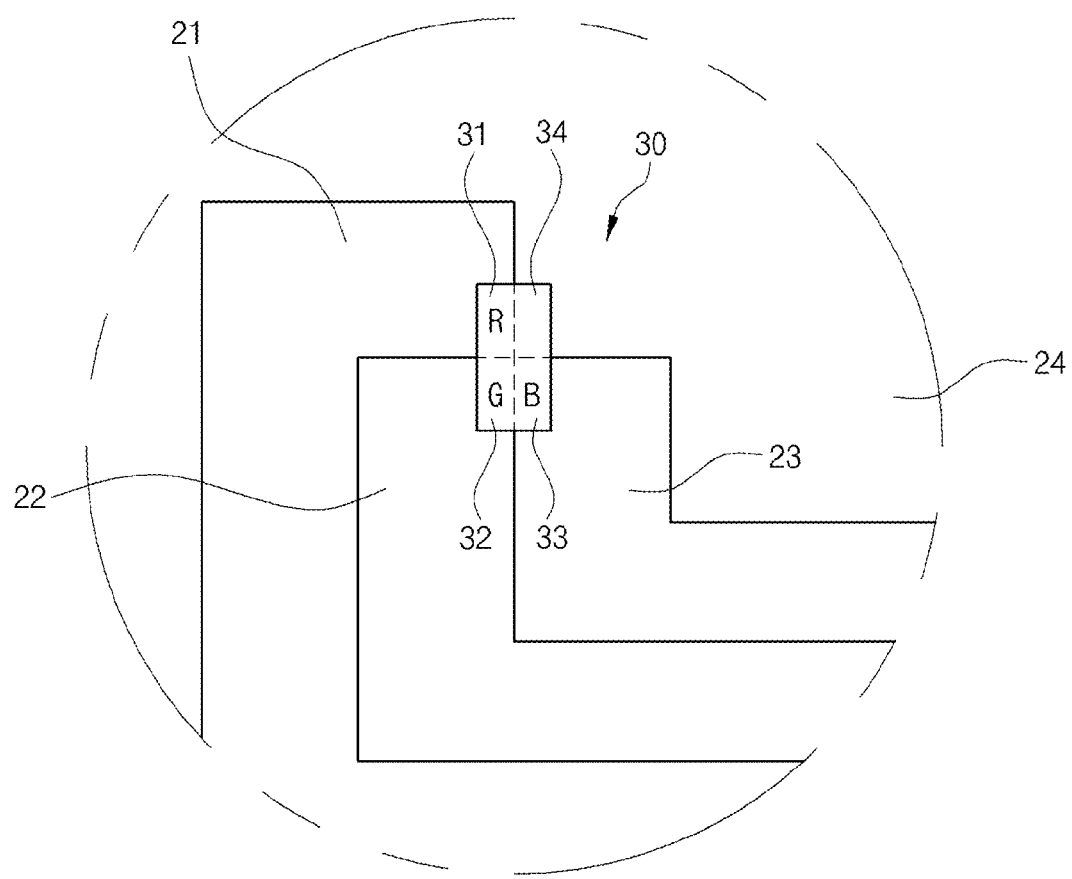
FIG. 3 is an enlarged view of the conductive substrate of FIG. 2.

FIG. 1 is a flowchart illustrating the process of coating a conductive substrate with an adhesive according to the present invention, FIG. 2 illustrates a portion of a conductive substrate using the process of coating a conductive substrate with an adhesive according to the present invention, and FIG. 3 is an enlarged view illustrating the conductive substrate of FIG. 2.

As illustrated in FIGS. 2 and 3, a conductive substrate 10 is configured such that an electrode 20, formed by coating one surface of the substrate with a conductive material, is divided into a plurality of patterns 21 to 24 through an etching process, and a circuit element 30 is bonded to the end of each of the patterns 21 to 24. Also, connectors 11 are formed with transparent conductive tape so as to transmit control signals to individual patterns 21 to 24 from a controller (not shown) that connects one side of the conductive substrate 10 with the outside.

The circuit element 30 includes two or more terminals 31 to 34 for transmitting electrical signals to individual patterns 21 to 24, and the terminals thereof are bonded to respective patterns 21 to 24. As such, the circuit element 30 is bonded to the conductive substrate by means of a conductive adhesive and a non-conductive adhesive, which are applied on the upper surfaces of the patterns 21 to 24.

The conductive adhesive is used to bond the patterns 21 to 24 and the terminals 31 to 34 of the circuit element 30 to each other so as to enable electrical conduction there between, and the non-conductive adhesive is applied on the areas where electrical conduction between the patterns 21 to and the circuit element 30 must be prevented from occurring. The conductive adhesive and the non-conductive adhesive are typically known, and thus a detailed description thereof is omitted.

As mentioned above, the present invention addresses a method of bonding the circuit element to the conductive substrate, wherein the light-emitting element of a transparent electronic display substrate corresponds to any one of various circuit elements. Therefore, for the sake of description, the light-emitting element of a transparent electronic display substrate is used as the circuit element 30 of the conductive substrate and is thus described below.

As illustrated in FIG. 3, the circuit element 30 is a four-electrode element configured such that a first anode terminal 31, a second anode terminal 32, a third anode terminal 33, and a cathode terminal 34 are tightly bonded to the first pattern 21, the second pattern 22, the third pattern 23, and the fourth pattern 24, compartmented by etching from the first to the third pattern 21 to 23, respectively. Individual terminals of the circuit element 30 are bonded by the conductive adhesive. The position of the adhesive that is applied and the amount of the adhesive that is discharged are set depending on the width and length of the bonding area 50 to which the circuit element 30 is bonded, thereby preventing short circuits from occurring due to contact between the conductive adhesives even when the adhesive applied on the electrode 20 spreads upon bonding the circuit element 30, and also preventing the aesthetic appearance from deteriorating due to the flow of the adhesive out of the bonding area 50 of the circuit element 30.

Therefore, as illustrated in FIG. 1, the method of coating the conductive substrate with the adhesive according to the present invention includes measuring the size, including width and length, of the bonding area 50 to which the circuit element 30 is bonded (S11); setting the nozzle 61 of an adhesive-discharging device 60 depending on the size of the bonding area 50 (S12); setting reference lines of the bonding area 50 depending on the size of the bonding area 50, thus determining adhesive-coating areas 40 (S13); applying an adhesive on positions of terminals of the circuit element 30 for individual wiring patterns 21 to 24 of the electrode 20 (S14); bonding the circuit element 30 to the bonding area 50 coated in S14 (S15); and hardening the adhesive (S16).

When measuring the bonding area 50 (S11), the width and length of the bonding area 50 to which the circuit element 30 is to be bonded are measured. Typically, the circuit elements 30 applied to the conductive substrate have various sizes. Thus, a plurality of circuit elements 30 having various sizes is classified into ranges of 0.8×1.6 to 1.5×1.6, 1.5×1.6 to 1.4×3.0, and 1.4×3.0 to 2.4×3.5. In this way, measuring the bonding area 50 is performed to enable appropriate selection of the nozzle 61 of the adhesive-discharging device 60, as described below.

In setting the nozzle (S12), the inner diameter of the nozzle 61 is selected depending on the width and length (in mm) of the bonding area 50 measured in S11. For example, when the size of the circuit element 30 ranges from 0.8×1.6 to 1.5×1.6 mm, the inner diameter of the nozzle 61 is 0.3 mm. Preferably, the inner diameter of the nozzle 61 is determined to be 0.4 mm when the size of the circuit element 30 ranges from 1.5×1.6 mm to 1.4×3.0 mm, and is determined to be 0.5 mm when the size thereof ranges from 1.4×3.0 to 2.8×3.5 mm.

Figure 4:
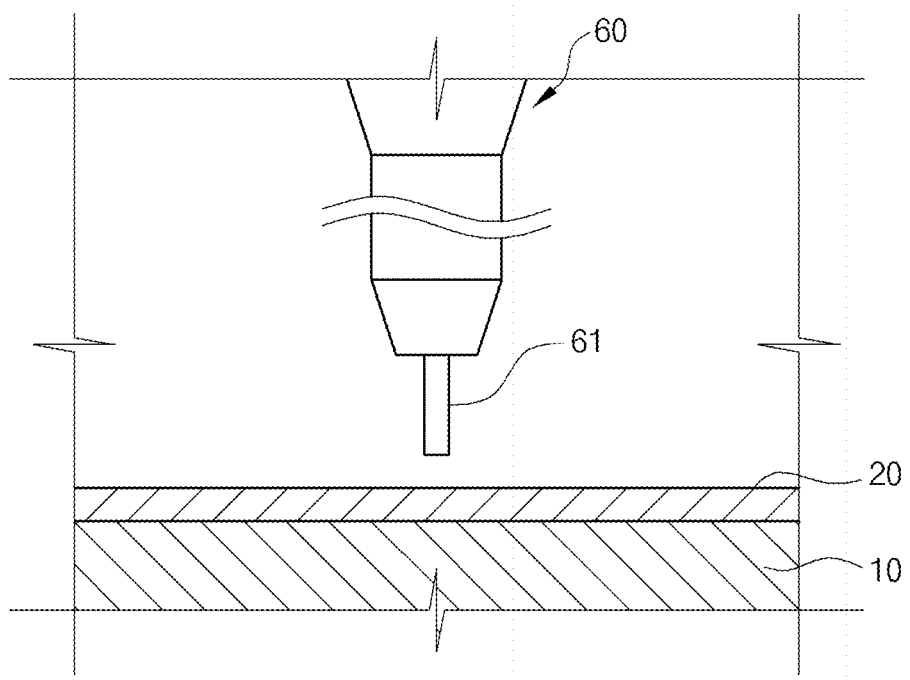
FIG. 4 illustrates an adhesive-discharging device in the process of coating a conductive substrate with an adhesive according to the present invention.

The adhesive-discharging device 60 having the nozzle 61 is illustrated in FIG. 4. FIG. 4 depicts the adhesive-discharging device used in the process of coating the conductive substrate with the adhesive according to the present invention.

As illustrated in FIG. 4, the adhesive-discharging device 60 includes a nozzle 61 for discharging a conductive or non-conductive adhesive on the upper surface of each of the compartmented patterns 21 to 24 of the electrode 20. The inner diameter of the nozzle 61 may vary, and the amount that is discharged may vary depending on the size of the nozzle, time or speed. In the present invention, the inner diameter of the nozzle 61 is selectively adopted depending on the width and length of the circuit element 30 that is bonded. The inner diameter of the nozzle of the adhesive-discharging device 60 is set to any one selected from among the above ranges when the size of the bonding area 50 is any one selected from among the above ranges.

Setting the reference lines (S13) is a step of calculating and setting the reference lines depending on the size of the bonding area 50 to which the circuit element 30 is bonded using the adhesive-discharging device 60, thereby determining adhesive-coating areas 40. Setting the reference lines (S13) is described as shown in FIGS. 5 to 9.

Figure 5:
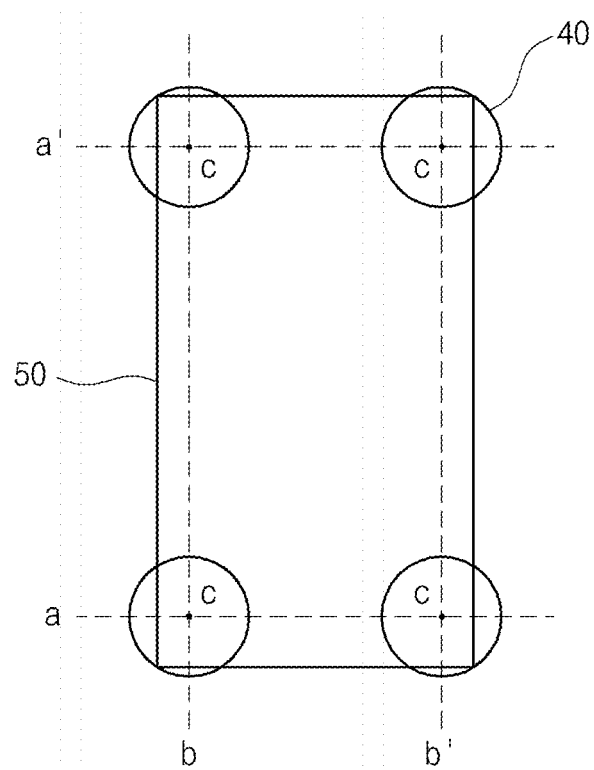
FIG. 5 illustrates a conductive adhesive according to a first embodiment in the process of coating a conductive substrate with an adhesive according to the present invention.
Figure 6:
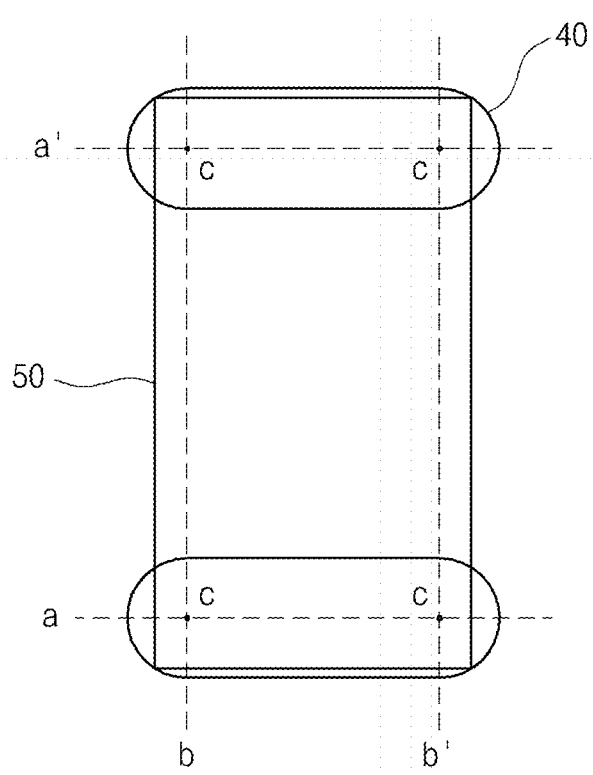
FIG. 6 illustrates a conductive adhesive according to a second embodiment in the process of coating a conductive substrate with a non-conductive adhesive according to the present invention.
Figure 7:
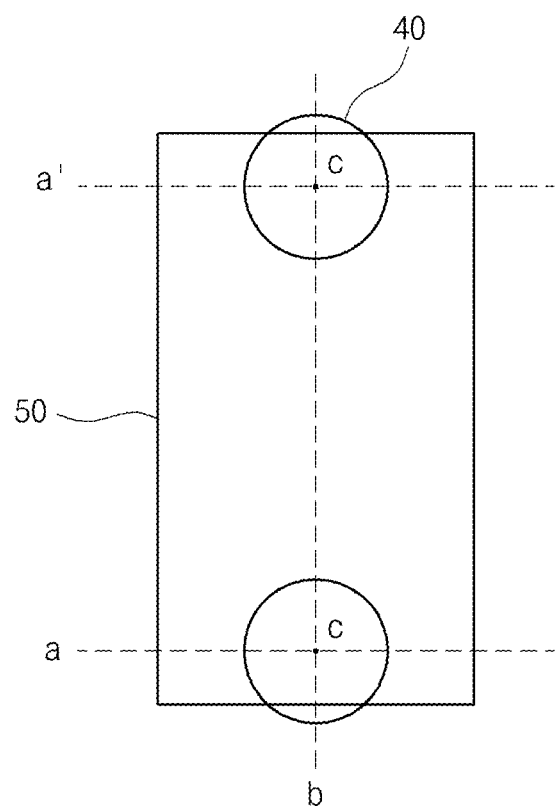
FIG. 7 illustrates a conductive adhesive according to a third embodiment in the process of coating a conductive substrate with an adhesive according to the present invention.
Figure 8:
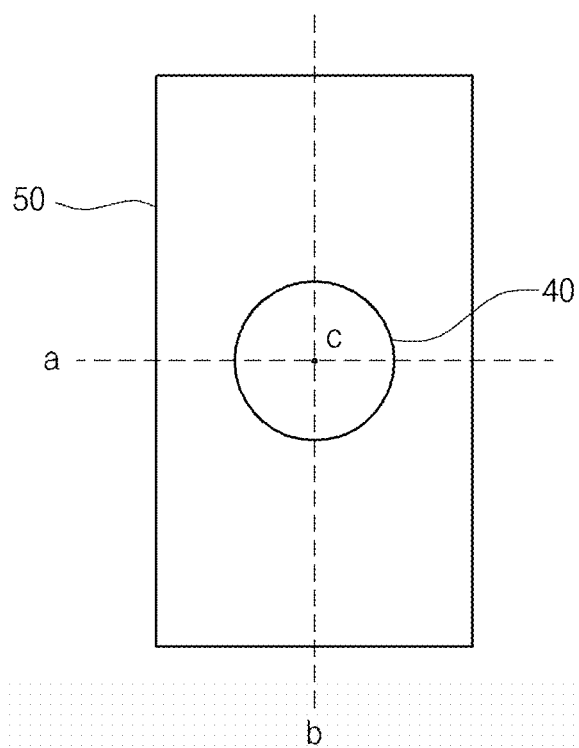
FIG. 8 illustrates a non-conductive adhesive according to a first embodiment in the process of coating a conductive substrate with an adhesive according to the present invention.
Figure 9:
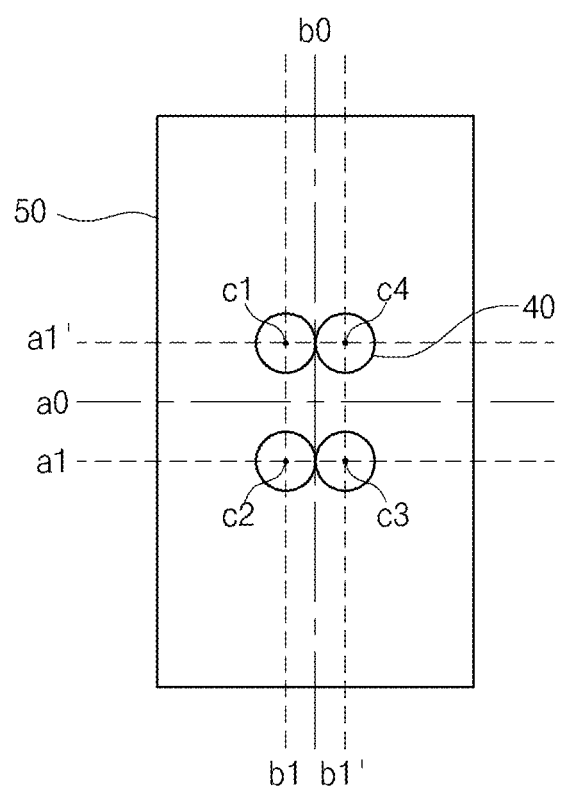
FIG. 9 illustrates a non-conductive adhesive according to a second embodiment in the process of coating a conductive substrate with an adhesive according to the present invention.

FIGS. 5 to 7 illustrate examples of bonding of the circuit element 30 using the conductive adhesive, and FIGS. 8 and 9 illustrate examples of bonding of the circuit element 30 using the non-conductive adhesive.

As illustrated in FIG. 5 for a conductive adhesive according to a first embodiment, the adhesive-discharging device 60 operates in a manner such that a total of four coating areas 40 are set on a bonding area 50 to which a four-electrode circuit element 30 is bonded, and are then coated with the conductive adhesive. Thus, when using the adhesive-discharging device 60, determined are longitudinal reference lines b, b' extending longitudinally from positions corresponding to 10% of the total width of the bonding area 50, and transverse reference lines a, a' extending transversely from positions corresponding to 10% of the total length thereof. Furthermore, the positions at which the transverse reference lines a, a' and the longitudinal reference lines b, b' intersect each other are determined to be center points. The longitudinal reference lines b, b' extend longitudinally from positions spaced apart by 10% of the total width of the bonding area from opposite transverse ends of the bonding area, and the transverse reference lines a, a' extend transversely from positions spaced apart by 10% of the total length of the bonding area from opposite longitudinal ends of the bonding area.

The nozzle 61 of the adhesive-discharging device 60 is located directly above each of the center points c at which the transverse reference lines a, a' and the longitudinal reference lines b, b' intersect each other, so that the adhesive is applied on the coating areas 40 in S14.

As illustrated in FIG. 6 for a conductive adhesive according to a second embodiment, in order to coat a bonding area 50 to which a two-electrode circuit element is bonded with the conductive adhesive, the adhesive-discharging device 60 operates in a manner such that transverse reference lines a, a' are set to extend in a transverse direction from positions spaced apart by 10% of the total length of the bonding area from opposite longitudinal ends of the bonding area, and also longitudinal reference lines b, b' are set to extend in a longitudinal direction from positions spaced apart by 10% of the total width of the bonding area from opposite transverse ends of the bonding area. Furthermore, center points c are set at positions at which the transverse reference lines a, a' and the longitudinal reference lines b, b' intersect each other. On the bonding area 50 where the two-electrode circuit element 30 is seated, the center points c are set in the same manner as when using the four-electrode circuit element 30, thereby determining a total of four center points, from which coating areas 40 are set.

As illustrated in FIG. 7 for a conductive adhesive according to a third embodiment, the adhesive-discharging device 60 operates in a manner such that a total of two center points c are determined on a bonding area 50 of a two-electrode circuit element 30, thus setting two coating areas 40, with are then coated with the adhesive. Specifically, in the third embodiment, when using the adhesive-discharging device 60, transverse reference lines a, a' are set to extend in a transverse direction from positions spaced apart by 10% of the total length of the bonding area from opposite longitudinal ends of the bonding area, and a longitudinal reference line b, is set to extend in a longitudinal direction from a position corresponding to 50% of the total width of the bonding area. As such, the two positions at which the transverse reference lines a, a' and the longitudinal reference line b, intersect each other are determined to be center points c, and coating areas 40 are set from the center points c.

In addition, a non-conductive adhesive according to a first embodiment is described with reference to FIG. 8.

For the non-conductive adhesive according to the first embodiment, the adhesive-discharging device 60 operates in a manner such that a transverse reference line a and a longitudinal reference line b are set to respectively extend in a transverse direction and a longitudinal direction from positions corresponding to 50% of the total length and width of a bonding area 50. Also, the position at which the transverse reference line and the longitudinal reference line b intersect each other is determined to be a center point c.

Typically, the non-conductive adhesive is applied to be positioned at the center of the circuit element 30 so as to prevent it from coming into contact with the conductive adhesive. However, in the case where the non-conductive adhesive is conventionally applied at positions where individual patterns 21 to 24 intersect each other, if the amount thereof is larger than the bonding area, the non-conductive adhesive may spread upon bonding the circuit element 30 and thus may flow out of the bonding area and come into contact with the conductive adhesive applied on the other patterns. In this case, resistance may increase upon the conduction of electrical signals, attributable to the contact between the conductive adhesive and the non-conductive adhesive, undesirably decreasing electrical conductivity.

However, in the present invention, the center points c of the circuit element 30 are precisely determined and the coating areas are set, and an amount of the adhesive that is appropriate for the coating areas is calculated and applied, whereby the conductive adhesive and the non-conductive adhesive do not come into contact with each other, ultimately preventing the electrical conductivity of the conductive substrate from decreasing.

As shown in FIG. 9, in order for the adhesive-discharging device 60 to discharge a non-conductive adhesive according to a second embodiment into the quartered areas on the basis of the center point, as in the non-conductive adhesive according to the first embodiment, the transverse reference line a and the longitudinal reference line b according to the first embodiment are set to a first transverse reference line a0 and a first longitudinal reference line b0, respectively, and furthermore, second transverse reference lines a1, a1' and second longitudinal reference lines b1, b1' are determined from the first transverse reference line a0 and the first longitudinal reference line b0.

Specifically, for the non-conductive adhesive according to the second embodiment, the adhesive-discharging device 60 operates in a manner such that the first transverse reference line a0 and the first longitudinal reference line b0 are set to extend in transverse and longitudinal directions from positions corresponding to 50% of the total length and width of a bonding area. Furthermore, the second transverse reference lines a1, a1' are set to extend in a transverse direction from positions spaced upwards and downwards by 10% of the total length of the bonding area from the first transverse reference line a0. Also, the second longitudinal reference lines b1, b1' are set to extend in a longitudinal direction from positions spaced leftwards and rightwards by 10% of the total width of the bonding area from the first longitudinal reference line b0.

Thus, a total of four second center points c1 to c4 are set through the intersections of the second transverse reference lines a1, a1' and the second longitudinal reference lines b1, b1'. When using the adhesive-discharging device 60, the total of four second center points c1 to c4 are set, and coating areas 40 are set by the second center points c1 to c4. The nozzle 61 of the adhesive-discharging device 60 is located directly above each of the second center points c1 to c4 on the set coating areas 40, and then the non-conductive adhesive is discharged thereby.

As for the non-conductive adhesive according to the first and the second embodiment, the reference lines may be selectively set using the adhesive-discharging device, taking into consideration the width and length of the circuit element 30 and the adhering area of the patterns 21 to 24.

Discharging the adhesive (S14) is performed by locating the nozzle 61 of the adhesive-discharging device 60 at the center point c determined in S13 and then discharging the adhesive in a predetermined amount. Here, when using the adhesive-discharging device 60, the amount of the adhesive that is discharged is calculated based on Mathematical Formula 1 below.

$$M = AVT \qquad \text{(Mathematical Formula 1)}$$

wherein M=the flow rate, A=the inner diameter of the nozzle, V=speed, and T=time.

In Mathematical Formula 1, the inner diameter A of the nozzle and the speed V are fixed, and the time T is changed, thereby adjusting the amount of the adhesive that is discharged depending on the inner diameter of the nozzle 61. Preferably, the amount of the adhesive that is applied is set within the range from 0.001 to 0.1 mg.

In Mathematical Formula 1, the inner diameter of the nozzle 61 is set to the inner diameter of the nozzle 61 selected so as to be suitable for the width and length (in mm) of the circuit element 30, and the period of time required to apply the adhesive using the nozzle 61 is set to 3 msec.

Bonding the circuit element (S15) is a step of bonding the circuit element 30 to the bonding area 50, after S14.

Hardening the adhesive (S16) is performed by placing the conductive substrate in a UV hardening device and then hardening the adhesive, after S15 for bonding the circuit element 30.

The effects of the present invention will now be described with reference to actual examples of setting the reference lines and discharging the adhesive in the amount calculated using Mathematical Formula 1 as above.

Figure 10:
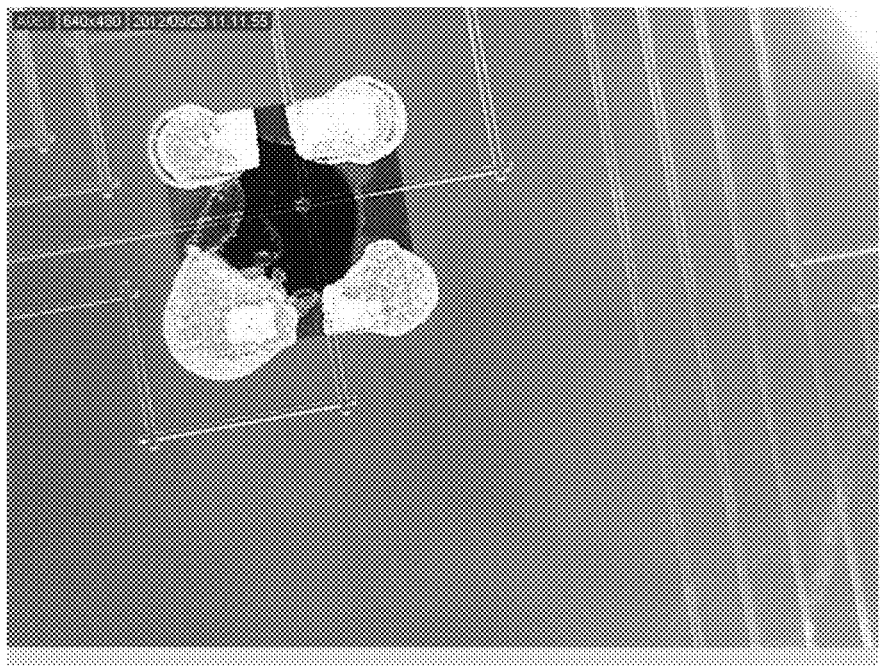
FIG. 10 illustrates a comparative embodiment of the present invention.
Figure 11:
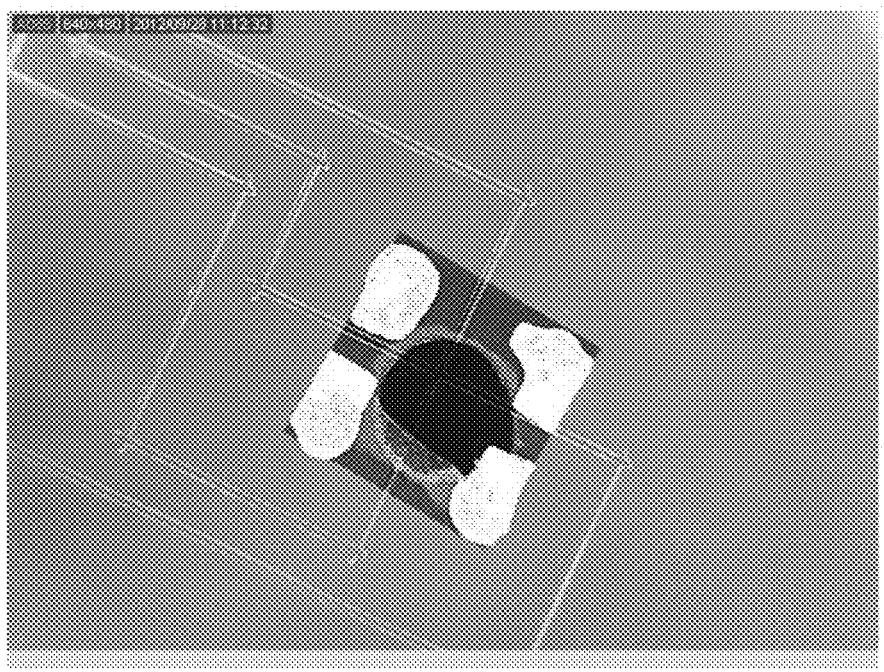
FIG. 11 illustrates the circuit element bonded to the adhesive applied according to the present invention.

FIG. 10 illustrates a comparative embodiment of the present invention, and FIG. 11 illustrates the bonding using the conductive adhesive according to the first embodiment in the present invention.

As illustrated in FIG. 10, the comparative embodiment shows the circuit element bonded by coating the entire pattern with the conductive adhesive. As seen in this drawing, the adhesive flowed into individual patterns out of the bonding area of the circuit element due to the pressure applied while bonding the circuit element. Such spread of the adhesive may have a negative influence on aesthetic appearances.

In contrast, as shown in the image of the embodiment of the present invention of FIG. 11, the adhesive did not flow into the bonding area of the circuit element, thus preventing the aesthetic appearance from deteriorating and short circuits from occurring due to the contact between the conductive adhesives of different patterns.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

The present invention addresses a method of coating a conductive substrate with an adhesive, wherein the amounts and positions of conductive and non-conductive adhesives for bonding a plurality of circuit elements to the conductive substrate are set, thus preventing the spread of the adhesive from causing defects including a poor aesthetic appearance, low electrical conductivity, and short circuits, ultimately making it possible to apply it to the fabrication of transparent electronic display substrates for advertising and guidance.

The invention claimed is:

1. A method of coating a transparent electronic display substrate with an adhesive using an adhesive-discharging device, the transparent electronic display substrate including a plurality of patterns formed on a transparent electrode resulting from coating one surface of a transparent substrate with a conductive material,
    wherein one or more center points are set at positions at which one or more transverse reference lines extending in a transverse direction and one or more longitudinal reference lines extending in a longitudinal direction intersect each other on a bonding area to which a circuit element is bonded, a nozzle of the adhesive-discharging device is positioned directly above each of the center points, and the adhesive is discharged in an amount calculated using the following Mathematical Formula:

$$M=AVT$$

wherein M=flow rate, A=inner diameter of nozzle, V=speed, and T=time, in which an inner diameter of the nozzle and the speed are fixed and the time is changed to thereby adjust the amount of the adhesive that is discharged depending on the inner diameter of the nozzle, and wherein the adhesive comprises a conductive adhesive and a non-conductive adhesive, a number of the center points on the bonding area is set in a range from 1 to 4, and the adhesive is discharged using the nozzle, which is positioned directly above each of the center points.

2. The method of claim 1, wherein transverse reference lines, which are set on the bonding area that is coated with the conductive adhesive, are set to extend in a transverse direction from positions spaced apart by 10% of a total length of the bonding area from opposite longitudinal ends of the bonding area,
    longitudinal reference lines are set to extend in a longitudinal direction from positions spaced apart by 10% of a total width of the bonding area from opposite transverse ends of the bonding area, and
    center points are set at positions at which the transverse reference lines and the longitudinal reference lines intersect each other.

3. The method of claim 1, wherein transverse reference lines of the conductive adhesive are set to extend in a transverse direction from positions corresponding to 10% of a total length of the bonding area from opposite longitudinal ends of the bonding area,
    a longitudinal reference line of the conductive adhesive is set to extend in a longitudinal direction from a position corresponding to 50% of a total width of the bonding area from a transverse end of the bonding area, and
    center points are set at positions at which the transverse reference lines and the longitudinal reference line intersect each other.

4. The method of claim 1, wherein a transverse reference line of the non-conductive adhesive is set to extend from a position corresponding to 50% of a total length of the bonding area,
    a longitudinal reference line of the non-conductive adhesive is set to extend in a longitudinal direction from a position corresponding to 50% of a total width of the bonding area, and
    a center point of the non-conductive adhesive is set at a position at which the transverse reference line and the longitudinal reference line intersect each other.

5. The method of claim 1, wherein transverse reference lines of the non-conductive adhesive include a first transverse reference line extending in a transverse direction from a position corresponding to 50% of a total length of the bonding area, and second transverse reference lines extending in a transverse direction from positions spaced upwards and downwards by 10% of the total length of the bonding area from the first transverse reference line,
    longitudinal reference lines of the non-conductive adhesive include a first longitudinal reference line extending in a longitudinal direction from a position corresponding to 50% of a total width of the bonding area, and second longitudinal reference lines extending in a longitudinal direction from positions spaced leftwards and rightwards by 10% of the total width of the bonding area from the first longitudinal reference line, and center points are set at positions at which the second transverse reference lines and the second longitudinal reference lines intersect each other.

6. The method of claim 1, wherein the bonding area is selected from among ranges of 0.8×1.6 to 1.5×1.6 mm, 1.5×1.6 to 1.4×3.0 mm, and 1.4×3.0 to 2.4×3.5 mm, and the inner diameter of the nozzle is selected from among 0.3 mm, 0.4 mm, and 0.5 mm, depending on the range of the bonding area.

\* \* \* \* \*